(12) United States Patent
Yu

(10) Patent No.: US 10,418,596 B2
(45) Date of Patent: Sep. 17, 2019

(54) OLED DISPLAY PANEL MANUFACTURING METHOD AND DEVICE THEREOF

(71) Applicant: Wuhan China Star Optoelectronics Semiconductor Display Technology Co., Ltd., Wuhan (CN)

(72) Inventor: Wei Yu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 15/574,158

(22) PCT Filed: Oct. 19, 2017

(86) PCT No.: PCT/CN2017/106795
§ 371 (c)(1),
(2) Date: Nov. 15, 2017

(87) PCT Pub. No.: WO2019/033537
PCT Pub. Date: Feb. 21, 2019

(65) Prior Publication Data
US 2019/0058164 A1 Feb. 21, 2019

(30) Foreign Application Priority Data
Aug. 16, 2017 (CN) .......................... 2017 1 0700001

(51) Int. Cl.
*H01L 51/56* (2006.01)
*H01L 51/52* (2006.01)
*C03C 8/24* (2006.01)
*B32B 37/12* (2006.01)
*B32B 37/06* (2006.01)

(52) U.S. Cl.
CPC .............. *H01L 51/56* (2013.01); *B32B 37/06* (2013.01); *B32B 37/12* (2013.01); *C03C 8/24* (2013.01); *H01L 51/524* (2013.01); *H01L 51/5246* (2013.01); *B32B 2037/1253* (2013.01); *B32B 2310/0843* (2013.01); *B32B 2457/206* (2013.01)

(58) Field of Classification Search
CPC .......................... H01L 51/5246; H01L 51/525
See application file for complete search history.

(56) References Cited

U.S. PATENT DOCUMENTS

2007/0128966 A1* 6/2007 Becken ................... C03C 27/06
445/25
2010/0279577 A1* 11/2010 Joo ......................... B23K 26/10
445/25

(Continued)

*Primary Examiner* — Charles D Garber
*Assistant Examiner* — Alia Sabur

(57) ABSTRACT

An organ light-emitting diode (OLED) display panel manufacturing method and an OLED display panel manufacturing device, the device includes a chamber configured to accommodate and heating an OLED lamination plate, where he OLED lamination plate has a substrate and a packaging lid adhered by glass adhesive and UV adhesive; a transparent lamination plate located in the chamber and configured to laminate the OLED lamination plate; a laser head located in the chamber, located on a side of the packaging lid above the transparent lamination plate and utilizing the laser beam irradiate a protruding portion of a start point of the glass adhesive.

1 Claim, 4 Drawing Sheets

(56) References Cited

U.S. PATENT DOCUMENTS

| | | | |
|---|---|---|---|
| 2011/0072854 A1* | 3/2011 | Nikkuni | C03C 27/06 65/36 |
| 2015/0194627 A1* | 7/2015 | Liu | H05B 33/10 428/76 |
| 2016/0300769 A1* | 10/2016 | Yang | H01L 51/56 |

* cited by examiner

OLED DISPLAY PANEL MANUFACTURING METHOD AND DEVICE THEREOF

RELATED APPLICATIONS

This application is a National Phase of PCT Patent Application No. PCT/CN2017/106795 having International filing date of Oct. 19, 2017, which claims the benefit of priority of Chinese Patent Application No. 201710700001.0 filed on Aug. 16, 2017. The contents of the above applications are all incorporated by reference as if fully set forth herein in their entirety.

FIELD AND BACKGROUND OF THE INVENTION

The present invention relates to the field of displaying technologies, especially to an organic light-emitting diode (OLED) display panel manufacturing method and an OLED display panel manufacturing device.

Organic light-emitting diode (OLED) displays are new generation displays. By making an organic film on an OLED substrate with the organic film disposed between cathode and anode metal or conductive layers and electrifying the electrodes, the organic film emits light. In comparison to liquid crystal displays, OLED displays have various advantages such as self-light-emission, short response time, wide viewing angles, and high color saturation, etc.

Water-dissolved oxygen in the air oxidizes active metal of a cathode of an OLED device and reacts with organic material, which causes malfunction of the OLED device. Therefore, an effective package of the OLED device sufficiently separating the OLED device from water-dissolved oxygen is of paramount importance for prolonging lifespan of the OLED device. Currently, OLED packaging methods includes drier and UV adhesive packaging, surface mount packaging, frit glue (glass adhesive) packaging, and thin film packaging, etc. The frit glue packaging has excellent packaging effect, is flexible and convenient and may be applied to products with different dimensions. Therefore, the frit glue packaging is a developmental packaging method.

With reference to FIG. 2A, during a packaging process of frit glue 203, because a start point of the frit glue 203 has a cured protruding portion 205, during lamination of a lid 202 and a substrate 201 under nitrogen ($N_2$) environment, one side with the protruding portion 205 frequently fails to be laminated inseparably. The other side without the protruding portion 205 is laminated inseparably, as shown in FIG. 2B. The lid 211 and the substrate 210 are laminated inseparably by frit glue 212 and UV adhesive 213.

With reference to FIG. 2A, during a laser scanning process, because UV adhesive 204 surrounding the lid 202 has been cured, even the frit glue 203 is melted first and then cured again during laser scanning, the cured UV adhesive 204 constantly keeps cured and thus maintains the above loosely laminated status. Therefore, after laser scanning the re-cured frit glue 203 still cannot tightly adhere the lid 202 and the substrate 201 together. Clearances keep existing between the lid 202 and the substrate 201. As such, after periphery of the UV adhesive 204 is cut, an obtained OLED display panel packaged by the frit glue 203 has week sealability, and water-dissolved oxygen in the air enters an internal of the OLED device through the clearances to fail the package.

As described above, according to the conventional OLED display panel manufacturing method and device, during the process of first softening and then curing the protruding portion of the start point of the glass adhesive, because the UV adhesive surrounding the glass adhesive has been cured and maintains the loosely laminated status, under $N_2$ environment one side of the lid and the substrate with the protruding portion fail to be inseparably laminated together such that the OLED display panel has weak sealability and negatively influences the packaging.

SUMMARY OF THE INVENTION

The present invention provides an Organic light-emitting diode (OLED) display panel manufacturing method and an OLED display panel manufacturing device that laminate a packaging lid and a substrate tightly to ensure excellent sealability and further guarantee packaging effect.

To solve the above issues, the present invention provides technical solutions as follows.

The present invention provides an organic light-emitting diode (OLED) display panel manufacturing device comprising:

a chamber configured to accommodate an OLED lamination plate and configured to heat the OLED lamination plate, wherein the OLED lamination plate is located in the chamber, the OLED lamination plate comprises a substrate and a packaging lid disposed opposite to the substrate, and the substrate and the packaging lid are adhered together by glass adhesive and UV adhesive;

a transparent lamination plate located in the chamber, configured to laminate the OLED lamination plate packaged by the UV adhesive, wherein the transparent lamination plate comprises a first transparent lamination plate and a second transparent lamination plate disposed opposite to the first transparent lamination plate; and a laser head located in the chamber and located on a side of the packaging lid above the first transparent lamination plate, and the laser head emitting laser beam and utilizing the laser beam to irradiate a protruding portion of a start point of the glass adhesive;

wherein an area of the first transparent lamination plate is equal to an area of the second transparent lamination plate and is greater than an area of the OLED lamination plate.

According to a preferred embodiment of the present invention, the OLED lamination plate is disposed between the first transparent lamination plate and the second transparent lamination plate and is covered by the first transparent lamination plate.

According to a preferred embodiment of the present invention, the first transparent lamination plate and the second transparent lamination plate are configured to move toward or move away from each other.

According to a preferred embodiment of the present invention, the OLED lamination plate comprises at least one OLED device, the start point of the glass adhesive outside the at least one OLED device comprises the protruding portion, the chamber comprises at least one laser head, and the laser head is located above the protruding portion.

According to a preferred embodiment of the present invention, the laser head emits laser beam, and an extent of irradiation of the laser beam is greater than an extent of the protruding portion.

According to a preferred embodiment of the present invention, the chamber comprises an adhesive-thickness detector configured to detect a position of the protruding portion of the glass adhesive of the OLED lamination plate, and the laser head is movably disposed in the chamber and is configured to precisely move to a position right above the protruding portion.

According to a preferred embodiment of the present invention, after temperature in the chamber reaches 80° C., the first transparent lamination plate and the second transparent lamination plate are configured to move toward each other for lamination.

According to a preferred embodiment of the present invention, the first transparent lamination plate is configured to perform a lamination operation with the second transparent lamination plate, and is configured to stop the lamination operation and to move away from the second transparent lamination plate when the glass adhesive and the packaging lid are tightly laminated.

The present invention also provides an OLED display panel manufacturing method utilizing the OLED display panel manufacturing device as described above, the OLED display panel manufacturing method comprises curing an UV adhesive in the OLED lamination plate under nitrogen ($N_2$) environment, and the OLED display panel manufacturing method further comprises steps as follows:

step S101: placing the laminated OLED lamination plate between the first transparent lamination plate and the second transparent lamination plate and tightly clamping the OLED lamination plate;

step S102: activating the laser head above the first transparent lamination plate configured to be laminated on the side of the packaging lid to emit laser beam to irradiate the protruding portion of the start point of the glass adhesive of the OLED lamination plate, and heating the chamber to increase the temperature of the chamber to 70° C. to 90° C.;

step S103: moving the first transparent lamination plate and the second transparent lamination plate toward each other to laminate the OLED lamination plate till the glass adhesive are tightly laminated with the packaging lid;

step S104: transporting the OLED lamination plate to a laser curing machine to proceed with glass adhesive curing and cutting, and then obtaining display panels packaged by the glass adhesive.

The present invention also provides an OLED display panel manufacturing device comprising:

a chamber configured to accommodate an OLED lamination plate, and configured to heat the OLED lamination plate, wherein the OLED lamination plate is located in the chamber, the OLED lamination plate comprises a substrate and a packaging lid disposed opposite to the substrate, and the substrate and the packaging lid are adhered together by glass adhesive and UV adhesive;

a transparent lamination plate located in the chamber, configured to laminate the OLED lamination plate packaged by the UV adhesive, wherein the transparent lamination plate comprises a first transparent lamination plate and a second transparent lamination plate disposed opposite to the first transparent lamination plate; and a laser head located in the chamber and located on a side of the packaging lid above the first transparent lamination plate, the laser head emitting laser beam and utilizing the laser beam to irradiate a protruding portion of a start point of the glass adhesive.

According to a preferred embodiment of the present invention, the OLED lamination plate is disposed between the first transparent lamination plate and the second transparent lamination plate and is covered by the first transparent lamination plate.

According to a preferred embodiment of the present invention, the first transparent lamination plate and the second transparent lamination plate are configured to move toward or move away from.

According to a preferred embodiment of the present invention, the OLED lamination plate comprises at least one OLED device, the start point of the glass adhesive outside the at least one OLED device comprises the protruding portion, the chamber comprises at least one laser head, and the laser head is located above the protruding portion.

According to a preferred embodiment of the present invention, the laser head emits laser beam, and an extent of irradiation of the laser beam is greater than an extent of the protruding portion.

According to a preferred embodiment of the present invention, the chamber comprises an adhesive-thickness detector configured to detect a position of the protruding portion of the glass adhesive of the OLED lamination plate, and the laser head is movably disposed in the chamber and is configured to precisely move to a position right above the protruding portion.

According to a preferred embodiment of the present invention, after temperature in the chamber reaches 80° C., the first transparent lamination plate and the second transparent lamination plate are configured to move toward each other for lamination.

According to a preferred embodiment of the present invention, the first transparent lamination plate is configured to perform a lamination operation with the second transparent lamination plate, and is configured to stop the lamination operation and to move away from the second transparent lamination plate when the glass adhesive and the packaging lid are tightly laminated.

Advantageous effects of the present invention are described as follows. In comparison to conventional OLED display panel manufacturing method and device, the OLED display panel manufacturing method and device of the present invention makes the outside UV adhesive around the glass adhesive softened during a softening process of the protruding portion of the start point of the glass adhesive and utilizes the two oppositely disposed transparent lamination plates to laminate the OLED lamination plate such that the packaging lid and the substrate are laminated tightly, which ensures excellent sealability and guarantees sealing effect.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

Figure 1:
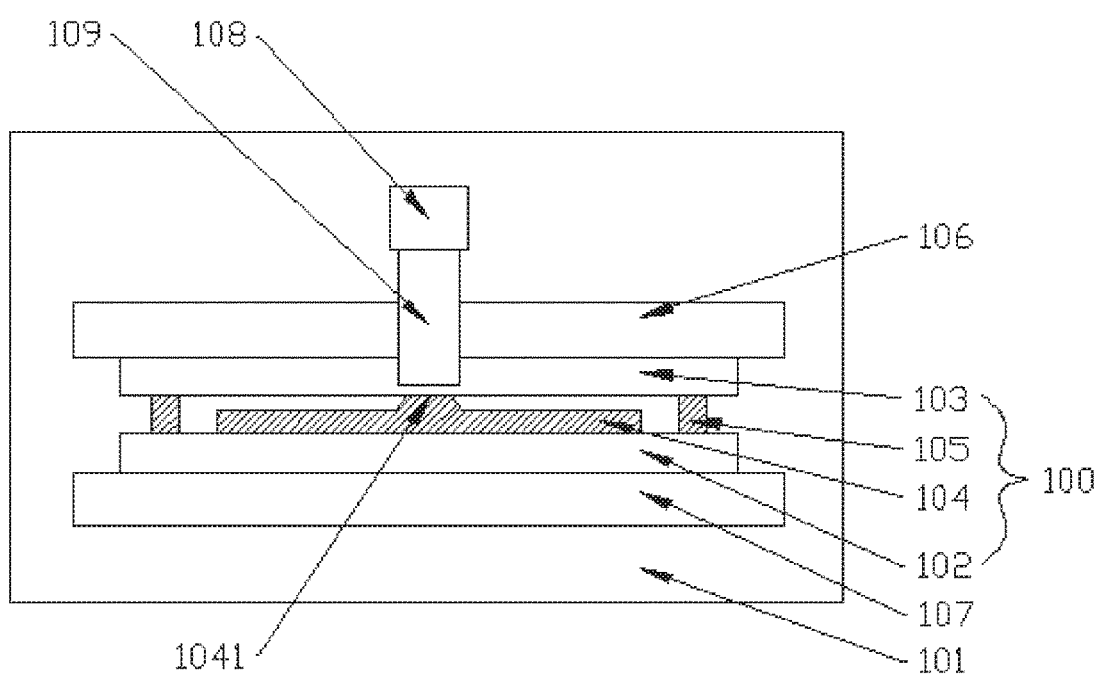
FIG. 1 is a schematic structural view of an OLED display panel manufacturing device of an embodiment in accordance with the present invention.
Figure 2A:
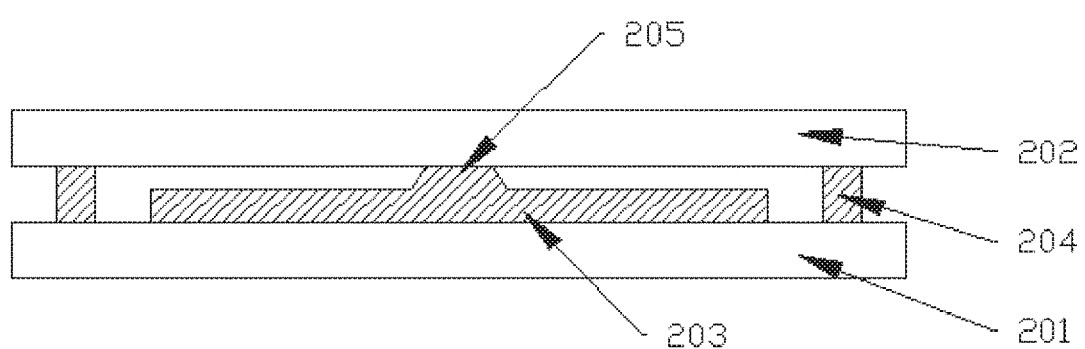
FIG. 2A is a schematic view of a conventional OLED lamination plate with a glass adhesive protruding portion in accordance with the prior art.
Figure 2B:
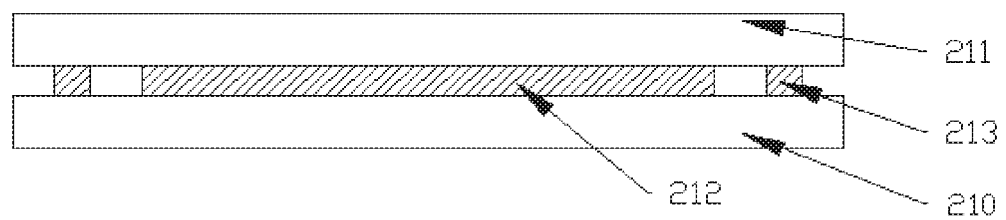
FIG. 2B is a schematic view of a conventional OLED lamination plate without any glass adhesive protruding portion in accordance with prior art.
Figure 3:
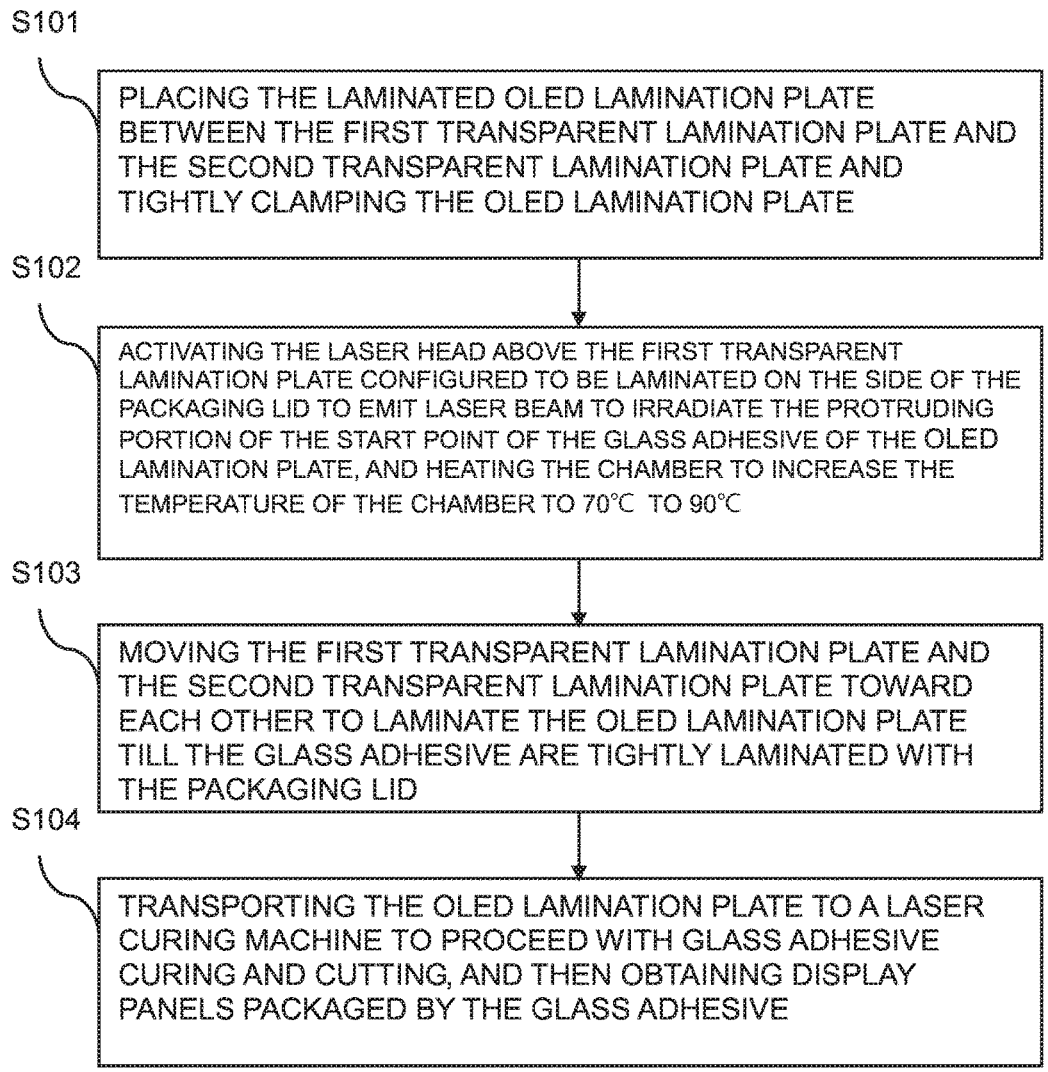
FIG. 3 is a flowchart of an OLED display panel manufacturing method of the embodiment in accordance with the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention aims at conventional Organic light-emitting diode (OLED) display panel manufacturing method and device, and solves issues of the conventional OLED display panel manufacturing method and device that during a packaging process the glass adhesive is formed with protruding portions to fail tight lamination between the packaging lid and the substrate and thus results in weak sealability and cause failure of the package. The embodiment of the present invention is able to solve the above-mentioned defects.

With reference to FIG. 1, an OLED display panel manufacturing device provided by an embodiment of the present invention comprises a chamber 101 configured to accommodate an OLED lamination plate 100 and configured to heat the OLED lamination plate 100, wherein the OLED lamination plate 100 is located in the chamber 101, the OLED lamination plate 100 comprises a substrate 102 and a packaging lid 103 disposed opposite to the substrate 102, and the substrate 102 and the packaging lid 103 are adhered together by glass adhesive 104 and UV adhesive 105; a transparent lamination plate located in the chamber 101, configured to laminate the OLED lamination plate 100 packaged by the UV adhesive 105, wherein the transparent lamination plate comprises a first transparent lamination plate 106 and a second transparent lamination plate 107 disposed opposite to the first transparent lamination plate 106; a laser head 108 located in the chamber 101 and located on a side of the packaging lid 103 above the first transparent lamination plate 106, and the laser head 108 emitting laser beam 109 and utilizing the laser beam 109 to irradiate a protruding portion 1041 of a start point of the glass adhesive 104.

An area of the first transparent lamination plate 106 is equal to an area of the second transparent lamination plate 107 and is greater than an area of the OLED lamination plate 100. The OLED lamination plate 100 is disposed between the first transparent lamination plate 106 and the second transparent lamination plate 107 and is covered by the first transparent lamination plate 106. The first transparent lamination plate 106 and the second transparent lamination plate 107 may move toward or move away from each other. The first transparent lamination plate 106 and the second transparent lamination plate 107 move toward each other to laminate the substrate 102 and the packaging lid 103 such that the two plates are hermetically sealed and laminated; After the lamination operation, the first transparent lamination plate 106 and the second transparent lamination plate 107 move away from each other to facilitate accessing the substrate 102.

The OLED lamination plate 100 comprises at least one OLED device (not shown in the figures), a start point of the frame-like glass adhesive 104 outside the OLED device comprises the protruding portion 1041. The chamber 101 comprises at least one the laser head 108. The laser head 108 is located right above the protruding portion 1041. The laser head 108 emits laser beam 109, and the laser beam 109 irradiates the protruding portion 1041. An extent of irradiation is greater than an extent of the protruding portion 1041. After temperature in the chamber 101 reaches 80° C., the first transparent lamination plate 106 and the second transparent lamination plate 107 move toward each other for lamination.

Preferably, the chamber 101 comprises an adhesive-thickness detector (not shown in the figures) configured to detect a thickness of the glass adhesive 104 of the OLED lamination plate 100 to ascertain a position of the protruding portion 1041. The laser head 108 is movably disposed in the chamber 101 and is configured to precisely move to a position right above the protruding portion 1041 according to signals transmitted by the adhesive-thickness detector. The OLED lamination plate 100 comprises at least one the OLED device, and the glass adhesive 104 surrounds one OLED device. The frame-liked UV adhesive 105 surrounds all of the OLED devices and adheres the substrate 102 and the packaging lid 103 together by the glass adhesive 104 and the UV adhesive 105 to form the OLED lamination plate 100.

The present invention further provides an OLED display panel manufacturing method utilizing the aforementioned OLED display panel manufacturing device and comprising coating the cleaned packaging lid with frame-like glass adhesive by a dispenser. Because a start points exist during the coating process, to ensure the glass adhesive is formed as a closed loop, these start points need to be linked such that the glass adhesive is accumulated on the star points. The height of the glass adhesive of the start points is greater than heights of other portions and form a protruding portion. The glass adhesive is baked and cured under high temperature. the temperature for baking is usually greater than 500° C. Then, under nitrogen ($N_2$) environment, the packaging lid coated with the glass adhesive is further coated with a loop of UV adhesive therearound. The UV adhesive may temporarily fasten the packaging lid and the substrate, and temporarily isolate the OLED device from ambient air. Next, under $N_2$ environment, the packaging lid and the substrate are laminated and irradiated by UV light to cure the UV adhesive. The OLED display panel manufacturing method further comprises steps as follows:

S101: placing the laminated OLED lamination plate between the first transparent lamination plate and the second transparent lamination plate, and tightly clamping the OLED lamination plate;

S102: activating the laser head above the first transparent lamination plate configured to be laminated on the side of the packaging lid to emit laser beam to irradiate the protruding portion of the start point of the glass adhesive of the OLED lamination plate, and heating the chamber to increase the temperature of the chamber to 70° C. to 90° C.;

S103: moving the first transparent lamination plate and the second transparent lamination plate toward each other to laminate the OLED lamination plate till the glass adhesive are tightly laminated with the packaging lid;

S104: transporting the OLED lamination plate to a laser curing machine to proceed with glass adhesive curing and cutting, and then obtaining display panels packaged by the glass adhesive.

when the OLED lamination plate is placed, a surface thereof with the packaging lid faces the laser head. When the protruding portion is softened and the temperature in the chamber reaches 80° C., the UV adhesive is softened and the first transparent lamination plate and the second transparent lamination plate are laminated. When the glass adhesive and the packaging lid are tightly laminated, the lamination operation is stopped, and the first transparent lamination plate and the second transparent lamination plate move away from each other for post operations.

In comparison to the conventional technologies, the OLED display panel manufacturing method and device provided by the present invention makes the outside UV adhesive around the glass adhesive softened during a softening process of the protruding portion of the start point of the glass adhesive and utilizes the two oppositely disposed transparent lamination plates to laminate the OLED lamination plate such that the packaging lid and the substrate are laminated tightly, which ensures excellent sealability and guarantees sealing effect.

As described above, although the present invention has disclosed the preferred embodiments as above, the above preferred embodiments are not used to limit the present invention. A person of ordinary skill in the art may implements various changes and modifications without departing from the spirit and the scope of the present invention. Therefore, the protecting scope of the present invention is based on the scope of the claims.

What is claimed is:

1. An OLED display panel manufacturing method utilizing an OLED display panel manufacturing system;
   wherein the OLED display panel manufacturing system comprises:
      an OLED lamination plate comprising a substrate and a packaging lid disposed opposite to the substrate, the substrate and the packaging lid packaged by glass adhesive and UV adhesive;
      a chamber configured to hold the OLED lamination plate inside the chamber and configured to heat the OLED lamination plate;
      the chamber comprising a transparent lamination plate located in the chamber, the transparent lamination plate configured to laminate the OLED lamination plate packaged by the glass adhesive and UV adhesive, wherein the transparent lamination plate comprises a first transparent lamination plate and a second transparent lamination plate disposed opposite to the first transparent lamination plate; and
      the chamber further comprising a laser head located in the chamber and located on a side of the packaging lid above the first transparent lamination plate, wherein the laser head emits a laser beam at a protruding portion of a start point of the glass adhesive, and the laser head is located above the protruding portion;
   wherein an area of the first transparent lamination plate is equal to an area of the second transparent lamination plate and is greater than an area of the OLED lamination plate;
   wherein the OLED lamination plate further comprises at least one OLED device, the start point of the glass adhesive is located outside the at least one OLED device and comprises the protruding portion;
wherein the OLED display panel manufacturing method comprises curing an UV adhesive in the OLED lamination plate under nitrogen ($N_2$) environment, wherein the OLED display panel manufacturing method further comprises steps as follows:
step S101: placing the laminated OLED lamination plate between the first transparent lamination plate and the second transparent lamination plate and tightly clamping the OLED lamination plate;
step S102: activating the laser head above the first transparent lamination plate configured to be laminated on the side of the packaging lid to emit laser beam to irradiate a protruding portion of the start point of the glass adhesive of the OLED lamination plate, and heating the chamber to increase the temperature of the chamber to 70° C. to 90° C., wherein the laser head is located above the protruding portion;
step S103: moving the first transparent lamination plate and the second transparent lamination plate toward each other to laminate the OLED lamination plate;
step S104: transporting the OLED lamination plate to a laser curing machine, performing glass adhesive curing, and cutting the OLED lamination plate with the laser curing machine.

* * * * *